(12) United States Patent
Liu

(10) Patent No.: US 12,745,607 B2
(45) Date of Patent: Sep. 22, 2026

(54) DISPLAY PANEL HAVING SUB-PIXELS WITH DIFFERENT ORIENTING CHARACTERISTICS, AND A MANUFACTURING METHOD THEREOF

(71) Applicant: AUO Corporation, Hsinchu (TW)

(72) Inventor: Chung-Chan Liu, Hsinchu (TW)

(73) Assignee: AUO Corporation, Hsinchu (TW)

( * ) Notice: Subject to any disclaimer, the term of this patent is extended or adjusted under 35 U.S.C. 154(b) by 597 days.

(21) Appl. No.: 18/073,508

(22) Filed: Dec. 1, 2022

(65) Prior Publication Data

US 2023/0197536 A1 Jun. 22, 2023

(30) Foreign Application Priority Data

Dec. 17, 2021 (TW) ................................ 110147535

(51) Int. Cl.

*H10P 74/00* (2026.01)
*H10W 72/00* (2026.01)
*H10W 72/20* (2026.01)
*H10W 90/00* (2026.01)

(52) U.S. Cl.

CPC .......... *H10P 74/232* (2026.01); *H10W 90/00* (2026.01); *H10W 72/07223* (2026.01); *H10W 72/252* (2026.01); *H10W 72/253* (2026.01); *H10W 72/257* (2026.01); *H10W 90/724* (2026.01)

(58) Field of Classification Search

CPC ......... H01L 24/13; H01L 24/14; H01L 24/16; H01L 24/81; H01L 22/22; H01L 25/0753; H01L 2224/13111; H01L 2224/13139; H01L 2224/13144; H01L 2224/13147; H01L 2224/1319; H01L 2224/14505; H01L 2224/16225; H01L 2224/81132; H10H 20/857; H10H 20/01; H10H 20/85; H10H 29/142; H10K 50/8426; H10K 59/35; H10K 71/00

See application file for complete search history.

(56) References Cited

U.S. PATENT DOCUMENTS

| | | | | |
|---|---|---|---|---|
| 10,476,043 | B2 | 11/2019 | Lai et al. | |
| 11,777,052 | B2 | 10/2023 | Hsieh | |
| 2020/0280659 | A1 * | 9/2020 | Galor Gluskin | H04N 23/55 |
| 2021/0135047 | A1 * | 5/2021 | Takeya | H10H 20/01 |
| 2022/0005780 | A1 * | 1/2022 | Yamada | H10W 90/00 |

(Continued)

FOREIGN PATENT DOCUMENTS

CN 113054069 6/2021

*Primary Examiner* — Wael M Fahmy
*Assistant Examiner* — Tiberiu Dan Onuta
(74) *Attorney, Agent, or Firm* — JCIPRNET

(57) ABSTRACT

A display panel and a manufacturing method thereof are provided. The display panel includes a substrate, first sub-pixels and second sub-pixels. The first sub-pixels are disposed on the substrate. The first sub-pixels have a first orienting characteristic. A first adherent material is disposed between the first sub-pixels and the substrate. The second sub-pixels are disposed on the substrate. The second sub-pixels have a second orienting characteristic. A second adherent material is disposed between the second sub-pixels and the substrate. The first orienting characteristic and the second orienting characteristic are different. The first adherent material and the second adherent material are different.

13 Claims, 14 Drawing Sheets

(56) References Cited

U.S. PATENT DOCUMENTS

| | | | | |
|---|---|---|---|---|
| 2022/0038663 | A1* | 2/2022 | Hoshino | H04N 25/704 |
| 2022/0108978 | A1* | 4/2022 | Kajiyama | H01L 25/0753 |
| 2022/0399317 | A1* | 12/2022 | Lee | H10W 90/00 |

* cited by examiner

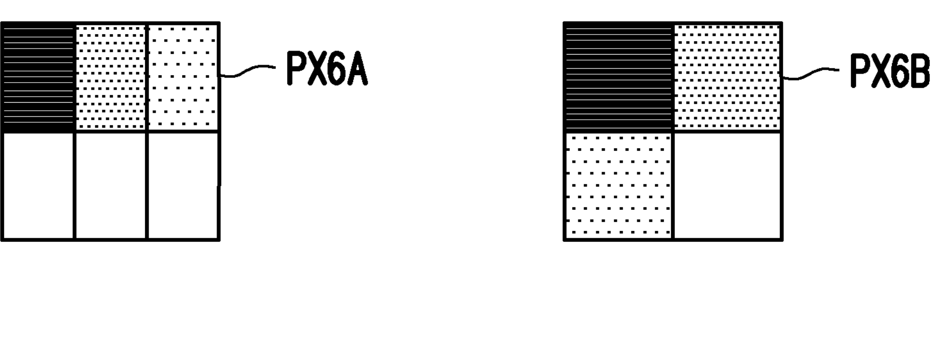
FIG. 6A FIG. 6B
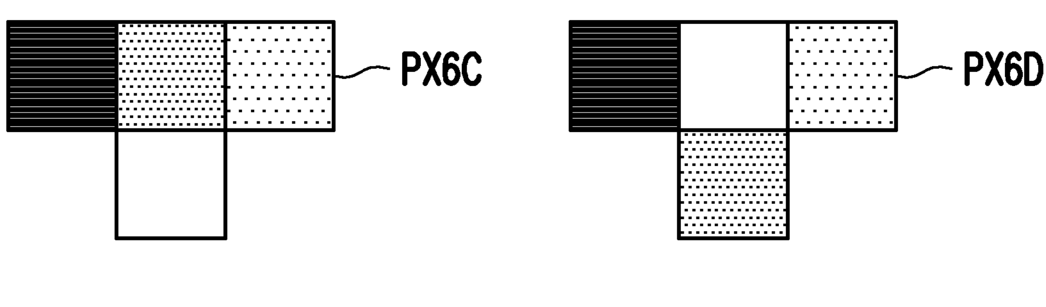
FIG. 6C FIG. 6D
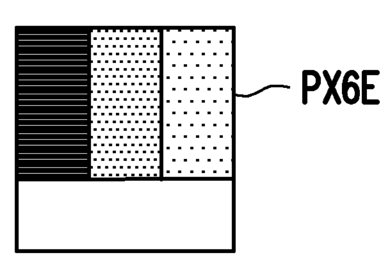
FIG. 6E

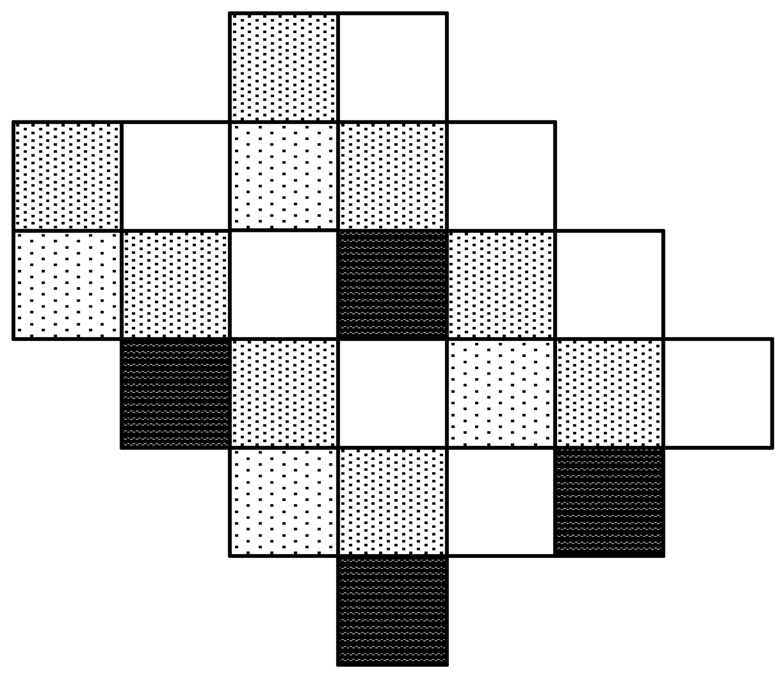
FIG. 6F
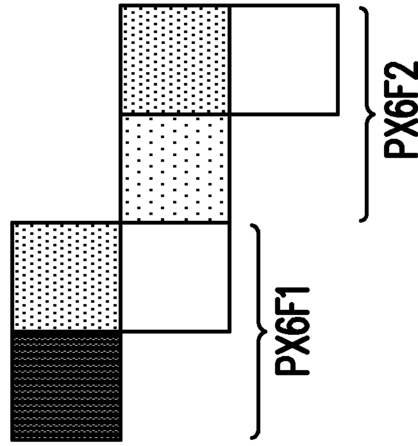

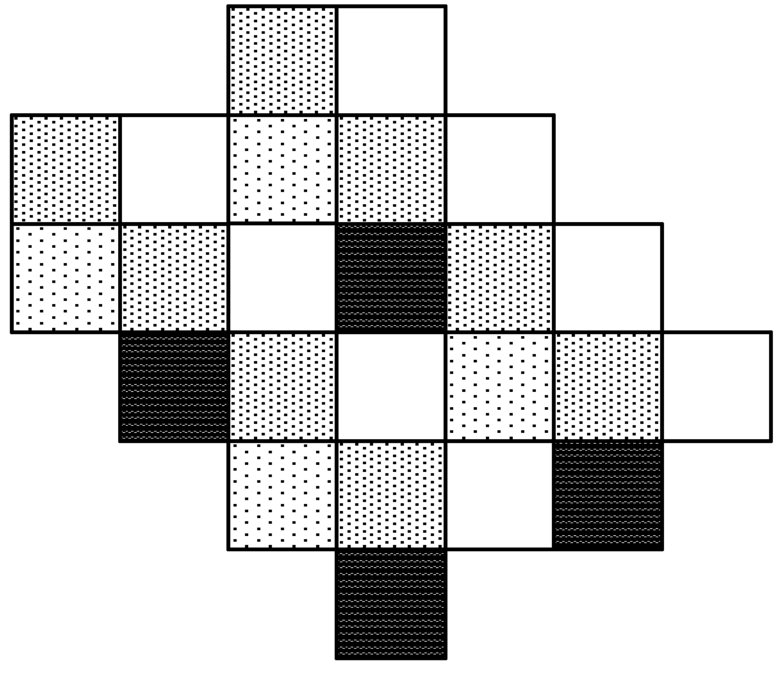
FIG. 6G
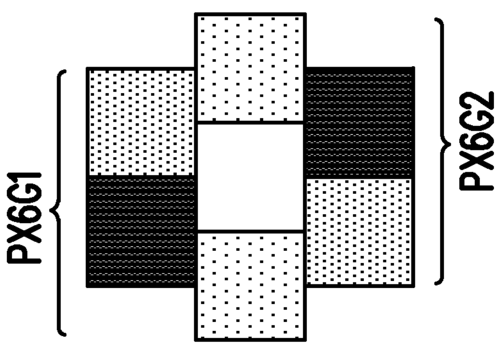

DISPLAY PANEL HAVING SUB-PIXELS WITH DIFFERENT ORIENTING CHARACTERISTICS, AND A MANUFACTURING METHOD THEREOF

CROSS-REFERENCE TO RELATED APPLICATION

This application claims the priority benefit of Taiwan application serial no. 110147535, filed on Dec. 17, 2021. The entirety of the above-mentioned patent application is hereby incorporated by reference herein and made a part of this specification.

BACKGROUND

Technical Field

The disclosure relates to a panel and a method, and more particularly, to a display panel and a manufacturing method thereof.

Description of Related Art

With the size increase of display panels, how to quickly and efficiently repair defective pixels in a display panel has become one of the important issues to be solved in the field.

SUMMARY

The disclosure provides a display panel and a manufacturing method thereof capable of efficiently repairing defective pixels in the display panel.

The display panel of the disclosure includes a substrate, first sub-pixels and second sub-pixels. The first sub-pixels are disposed on the substrate. The first sub-pixels have a first orienting characteristic, and a first adherent material is disposed between the first sub-pixels and the substrate. The second sub-pixels are disposed on the substrate. The second sub-pixels have a second orienting characteristic, and a second adherent material is disposed between the second sub-pixels and the substrate. The first orienting characteristic is different from the second orienting characteristic, and the first adherent material is different from the second adherent material.

The manufacturing method of the display panel of the disclosure includes steps as follows. A substrate is provided. First sub-pixels are disposed on the substrate. The first sub-pixels have a first orienting characteristic, and a first adherent material is disposed between the first sub-pixels and the substrate. Second sub-pixels are disposed on the substrate. The second sub-pixels have a second orienting characteristic, and a second adherent material is disposed between the second sub-pixels and the substrate. The first orienting characteristic is different from the second orienting characteristic, and the first adherent material is different from the second adherent material.

In summary, the display panel and the manufacturing method thereof of the disclosure can repair defects on the display panel through a relatively simple hardware device and a relatively short operation process to improve the display effect of the display panel.

BRIEF DESCRIPTION OF THE DRAWING

FIG. 6A to FIG. 6G are schematic views of the arrangement of pixels according to an embodiment of the disclosure.

DESCRIPTION OF THE EMBODIMENTS

Figure 1:
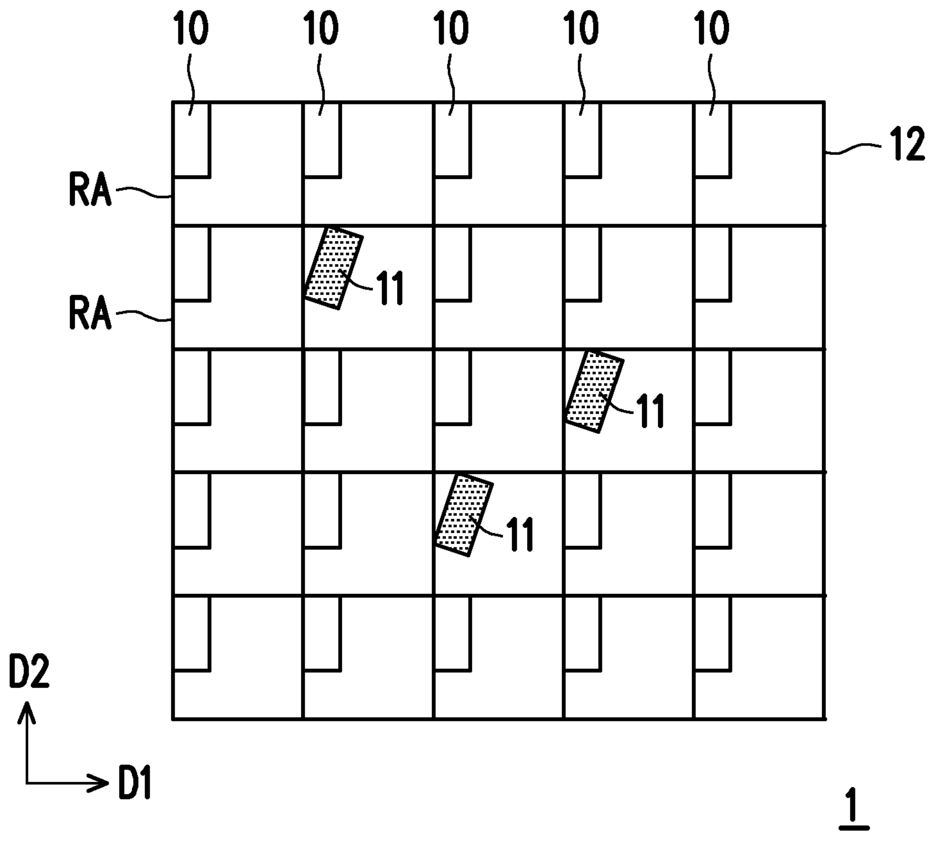
FIG. 1 is a schematic top view of a display panel according to an embodiment of the disclosure.

FIG. 1 is a schematic top view of a display panel 1 according to an embodiment of the disclosure. The display panel 1 includes multiple first pixels 10, multiple second pixels 11, and a substrate 12. The substrate 12 is divided into multiple display pixel regions RA, and the first pixels 10 and the second pixels 11 are disposed on the substrate 12 and in one corresponding display pixel region RA, respectively. Specifically, the first pixel 10 has a first orienting characteristic, the second pixel 11 has a second orienting characteristic, and the first orienting characteristic is different from the second orienting characteristic.

In some embodiments, the first pixels 10 and the second pixels 11 may be disposed through the same transposed element head but by different transposition procedures. For example, the transposed element head may first configure each first pixel 10 in each display pixel region RA on the substrate 12, then remove one defective first pixel 10 by performing an inspection, and next fill the second pixel 11 into a vacant display pixel region RA through the same transposed element head. Accordingly, the operation of repairing or replacing the defective first pixel 10 in the entire display panel 1 may be accomplished through the same transposed element head without shifting hardware devices. Therefore, the overall operation may be relatively simple, and the cost of additional hardware configuration may be prevented.

In some embodiments, the first pixel 10 and the second pixel 11 are taken from different wafers by transposed element heads, so the first pixel 10 and the second pixel 11 disposed on the substrate 12 may have different orienting characteristics. The orienting characteristic may include, for example, the position offset and the angle offset between each pixel and its corresponding display pixel region RA. For example, each first pixel 10 in FIG. 1 may have the consistent position offset and angle offset, and each second pixel may also have the consistent position offset and angle offset. Specifically, with respect to its corresponding display pixel region RA, each first pixel 10 is aligned with the upper left corner of the corresponding display pixel region RA, and the configuration direction of each first pixel 10 may be parallel to the extending direction (and the second direction D2) of the corresponding display pixel region RA. That is, there may be zero angle offset between each first pixel 10 and the display pixel region RA. In contrast, there may be position offset in the first direction D1 and/or the second direction D2 between each second pixel 11 and the upper left corner of the corresponding display pixel region RA, so that the second pixel 11 is not aligned with its corresponding display pixel region RA, and the configuration direction of the second pixels 11 is not parallel to the extending direction of the display pixel region RA. That is, there may be non-zero angle offset between each second pixel 11 and the display pixel region RA.

Therefore, the first pixels 10 have the same first orienting characteristics, and the second pixels 11 have the same second orienting characteristics. In the first orienting characteristic and the second orienting characteristic, the position offset of the first pixel 10 and the position offset of the second pixel 11 are different, and/or the angle offset of the first pixel 10 and the angle offset of the second pixel 11 are different.

On the other hand, in some embodiments, when configuring the first pixel 10, the transposed element head fixes the first pixel 10 in each display pixel region RA on the substrate 12 with a first adherent material. To optionally configure the second pixel 11 in the vacant display pixel region RA when the second pixel 11 is configured through the transposed element head, a second adherent material with viscosity is first coated in the vacant display pixel region RA while the second pixels 11 are being configured by the transposed element head. Accordingly, when the transposed element head fetches and presses the second pixel 11 on the substrate 12, the second pixel 11 may be adhered to the previous vacant display pixel region RA with the second adherent material, and thereby the replacement of the first pixel 10 is completed.

In some embodiments, the first pixel 10 and the second pixel 11 may be, for example, light-emitting diodes (LEDs), organic light-emitting diodes (OLEDs), mini LEDs, micro LEDs, quantum dot LEDs (QDs, such as QLEDs, QDLEDs), or other suitable pixels or materials. In some embodiments, the first adherent material is different from the second adherent material. The first adherent material may be solder, for example. The second adherent material may include, for example, metal, photoresists, resin, colloids, black light shielding layers, color filters, quantum dots, or other suitable materials. Furthermore, the metal may be, for example, gold, silver, copper, tin, or other suitable metals.

FIG. 2A to FIG. 2F are schematic top views illustrating a manufacturing process of a pixel PX2 in a display panel according to an embodiment of the disclosure.

Figure 2A:
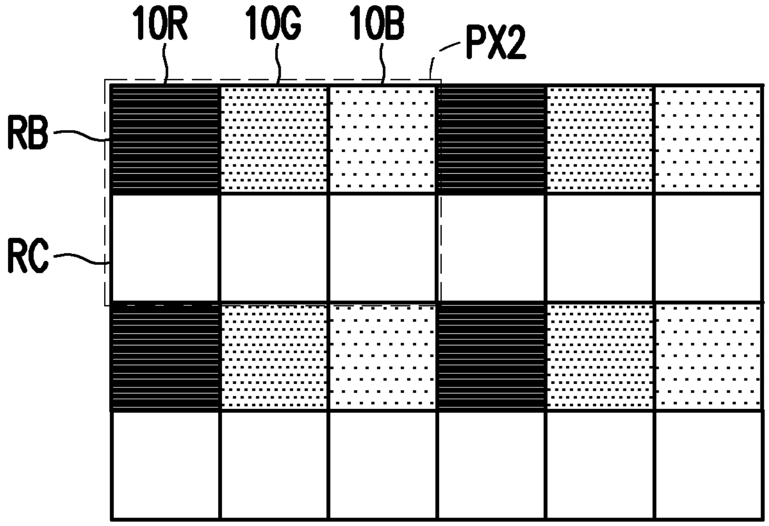
FIG. 2A to FIG. 2F are schematic top views illustrating a manufacturing process of a pixel in a display panel according to an embodiment of the disclosure.

In FIG. 2A, first, the pixel PX2 is disposed on the substrate 12, and the pixel PX2 has sub-pixels 10R, 10G, and 10B. The sub-pixels 10R, 10G, 10B may be configured to display colors, such as red, green, and blue, respectively. Each pixel PX2 may be disposed in a corresponding display pixel region. In the embodiment, the display pixel region of the pixel PX2 may be divided into three main pixel regions RB and three spare pixel regions RC. The sub-pixels 10R, 10G, 10B are each disposed in the corresponding main pixel regions RB. An adjacent spare pixel region RC is disposed next to each main pixel RB.

Not shown in FIG. 2A, however, the first adherent material is disposed between the sub-pixels 10R, 10G, 10B and the substrate 12, and the sub-pixels 10R, 10G, 10B may be fixed on the substrate 12 with the first adherent material. The first adherent material may be solder, for example.

Figure 2B:
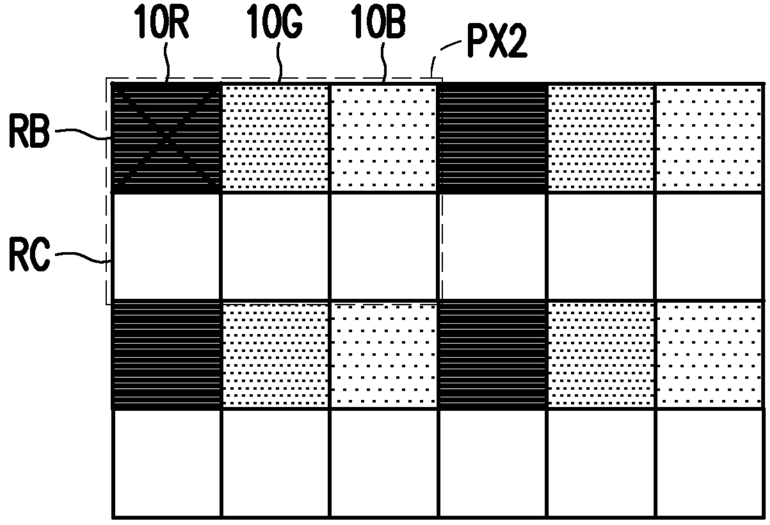

In FIG. 2B, each of the sub-pixels 10R, 10G, 10B on the pixel PX2 is individually inspected for defects. In the embodiment, it is determined that the sub-pixel 10R of the pixel PX2 in the upper left corner is a defective sub-pixel 10R after being inspected.

Figure 2C:
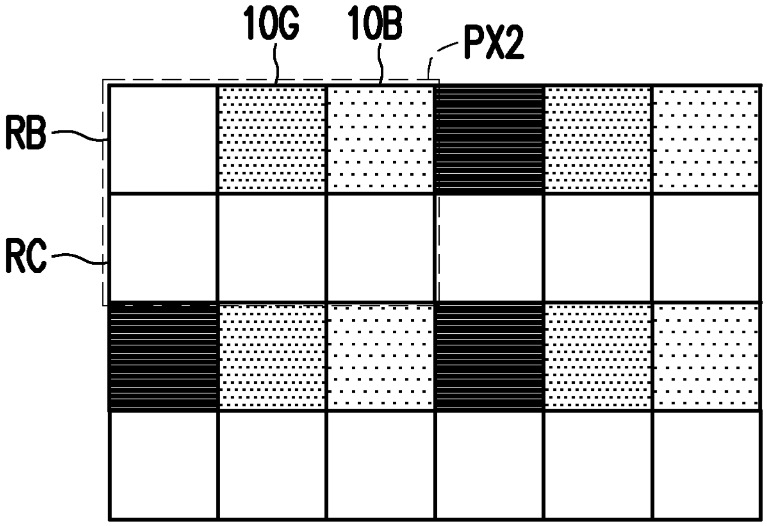

In FIG. 2C, the defective sub-pixel 10R may be removed from the pixel PX2 in the upper left corner. Therefore, in the pixel PX2 in the upper left corner, the main pixel region RB is vacant as the original sub-pixel 10R is removed.

Figure 2D:
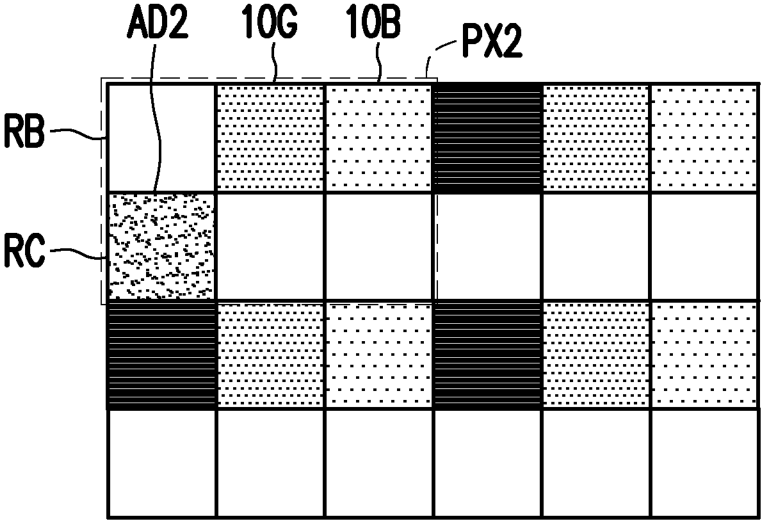

In FIG. 2D, in the pixel PX2 in the upper left corner, for the main pixel region RB where the sub-pixel 10R is previously disposed, the second adherent material different from the first adherent material may be coated on the adjacent spare pixel region RC.

In some embodiments, the second adherent material may be coated on the spare pixel region RC by ink jet printing (IJP). The second adherent material may be a conductive or non-conductive adherent material with viscosity, for example. In the embodiment, the second adherent material may include, for example, metals, photoresists, resin, colloids, black matrixes (BMs), color filters (CFs), quantum dots, or other suitable materials. Metals may include, for example, gold, silver, copper, tin, or other suitable metals.

The second adherent material may be, for example, a photoresist material in some embodiments. After the second adherent material is coated on the spare pixel region RC, the second adherent material may be exposed by laser direct imaging (LDI). Next, after being exposed, the second adherent material may be sticky. In the embodiment, the second adherent material may include, for example, metals, photoresists, resin, colloids, black light shielding layers, color filters, quantum dots, or other suitable materials. Metals may include, for example, gold, silver, copper, tin, or other suitable metals.

Figure 2E:
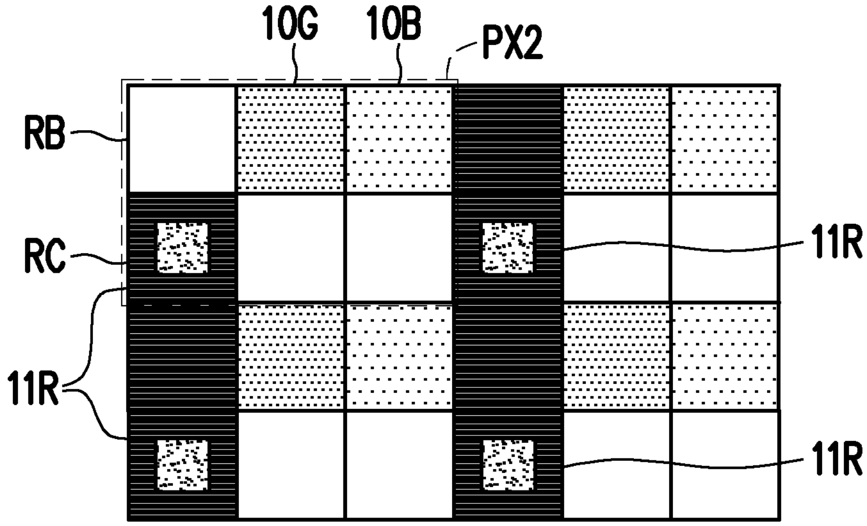

In FIG. 2E, the transposed element head may fetch multiple sub-pixels 11R from the spare wafer (not shown in FIG. 2A-FIG. 2F) and apply certain pressure on the sub-pixels 11R to press the column formed in the spare pixel region RC. More specifically, the sub-pixel 11R can be placed in the spare pixel region RC by the transposed element head, and the main pixel region RB where the sub-pixel 10R is disposed is next to the placed spare pixel region RC.

In some embodiments, when the second adherent material is conductive, the transposed element head may press the sub-pixel 11R onto the second adherent material to be adhered to the second adherent material. In some embodiments, when the second adherent material is non-conductive, the transposed element head may press the sub-pixel 11R on the substrate 12 with a relatively large pressure, so that the sub-pixel 11R may penetrate the second adherent material to be in direct contact with and connected to the wirings on the substrate 12.

Figure 2F:
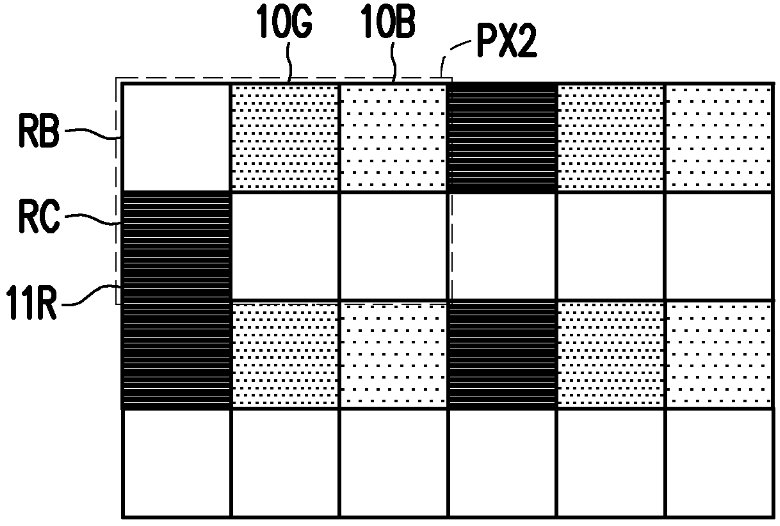

In FIG. 2F, when the transposed element head leaves the substrate 12, with the second adherent material, only the sub-pixel 11R in the pixel PX2 in the upper left corner may be left, so in the other pixels PX2 with no coating of the second adherent material, the sub-pixel 11R is not left in the spare pixel region RC of other pixels.

Therefore, by coating the second adherent material with viscosity, the substrate 12 may optionally stick and fetch required sub-pixels 11R from the spare pixel region RC by the transposed element head and leave other spare pixels with no configuration requirement vacant. The spare pixel region RC is vacant. In this way, in each pixel PX2, the sum of the number of sub-pixels configured therein is equal. Therefore, the number of sub-pixels in each pixel PX2 does not vary due to the replacement of defective sub-pixels, which can effectively maintain the brightness informality of the entire display panel and reduce unnecessary power consumption.

On the other hand, in some embodiments, the sub-pixels 10R, 10G, and 10B in FIG. 2A may also be disposed through the same transposed element head as that for configurating the sub-pixel 11R in FIG. 2E. After the sub-pixels 10R, 10G, and 10B are configured in the step of FIG. 2A, the defective sub-pixels may be replaced by the same transposed element head in the step of FIG. 2E to save the operation time of replacing the transposed element head, and therefore the overall hardware cost and operation time cost may be effectively saved.

FIG. 3A to FIG. 3F are schematic top views illustrating a manufacturing process of a pixel PX3 in another display panel according to an embodiment of the disclosure. The pixel PX3 shown in FIG. 3A to FIG. 3F may be similar to the pixel PX2 shown in FIG. 2A to FIG. 2F with one difference is that the pixel PX3 is configured with only the main pixel region RB and with no spare pixel region.

Figure 3A:
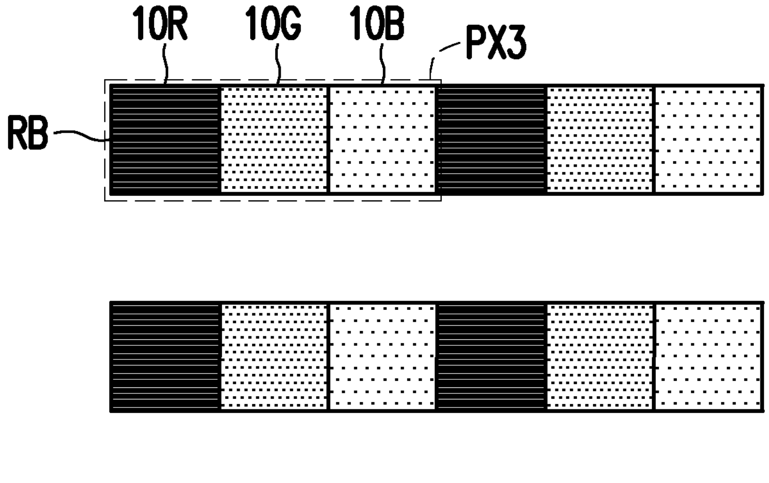
FIG. 3A to FIG. 3E and FIG. 3G are schematic top views illustrating a manufacturing process of a pixel in another display panel according to an embodiment of the disclosure.

In FIG. 3A, first, the pixel PX3 is disposed on the substrate 12, and the pixel PX3 has the sub-pixels 10R, 10G, and 10B. The sub-pixels 10R, 10G, and 10B may be disposed in the corresponding main pixel regions RB, respectively.

Not shown in FIG. 3A, however, the first adherent material is disposed between the sub-pixels 10R, 10G, 10B and the substrate 12, and the sub-pixels 10R, 10G, 10B may be fixed on the substrate 12 with the first adherent material. The first adherent material may be solder, for example.

Figure 3B:
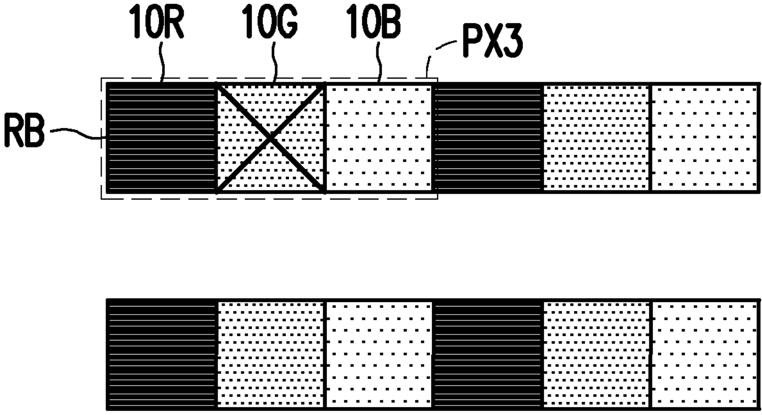

In FIG. 3B, each of the sub-pixels 10R, 10G, 10B on the pixel PX3 is individually inspected for defects. In the embodiment, it is determined that the sub-pixel 10G of the pixel PX3 in the upper left corner is a defective sub-pixel 10G after being inspected.

Figure 3C:
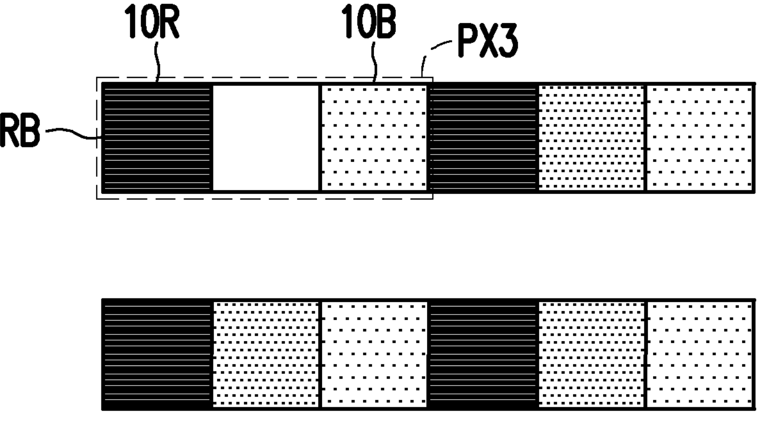

In FIG. 3C, the defective sub-pixel 10G may be removed from the pixel PX3 in the upper left corner. Therefore, in the pixel PX3 in the upper left corner, the main pixel region RB is vacant as the original sub-pixel 10G is removed.

Figure 3D:
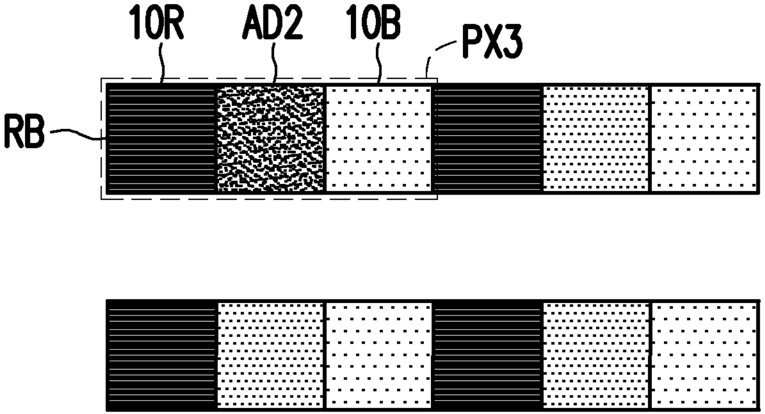

In FIG. 3D, in the pixel PX3 in the upper left corner, the second adherent material different from the first adherent material may be coated on the main pixel region RB where the sub-pixel 10G is previously disposed.

In some embodiments, the second adherent material may be coated on the spare pixel region RC by ink jet printing (IJP). The second adherent material may be a conductive or non-conductive adherent material with viscosity, for example. In the embodiment, the second adherent material may include, for example, metals, photoresists, resin, colloids, black matrixes (BMs), color filters (CFs), quantum dots, or other suitable materials. Metals may include, for example, gold, silver, copper, tin, or other suitable metals.

The second adherent material may be, for example, a photoresist material in some embodiments. After the second adherent material is coated on the spare pixel region RC, the second adherent material may be exposed by laser direct imaging (LDI). Next, after being exposed, the second adherent material may be sticky. In the embodiment, the second adherent material may include, for example, metals, photoresists, resin, colloids, black light shielding layers, color filters, quantum dots, or other suitable materials. Metals may include, for example, gold, silver, copper, tin, or other suitable metals.

Figure 3E:
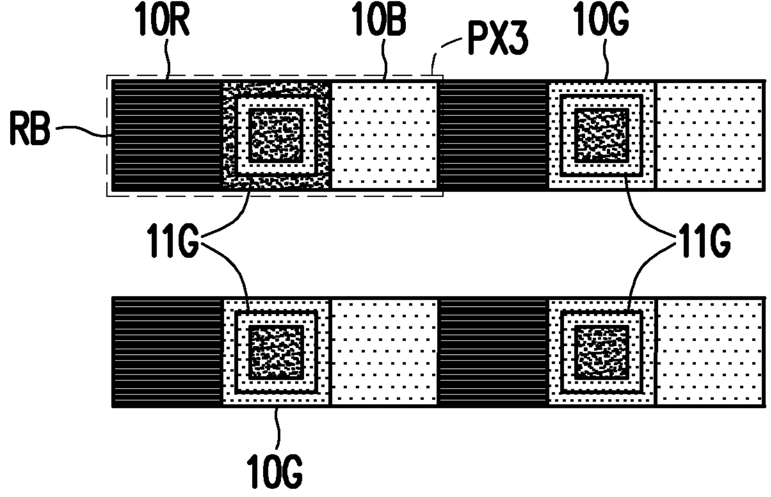

In FIG. 3E, the transposed element head may fetch multiple sub-pixels 11G from the spare wafer (not shown in FIG. 3A-FIG. 3F) and apply certain pressure on the sub-pixels 11G to press the column formed in the main pixel region RB. More specifically, the transposed element head may place one of the sub-pixels 11R on the main pixel region RB where the sub-pixel RB has been removed, while the other sub-pixels 11R are placed on the main pixel region RB where the sub-pixels 11R are not removed.

Figure 3F:
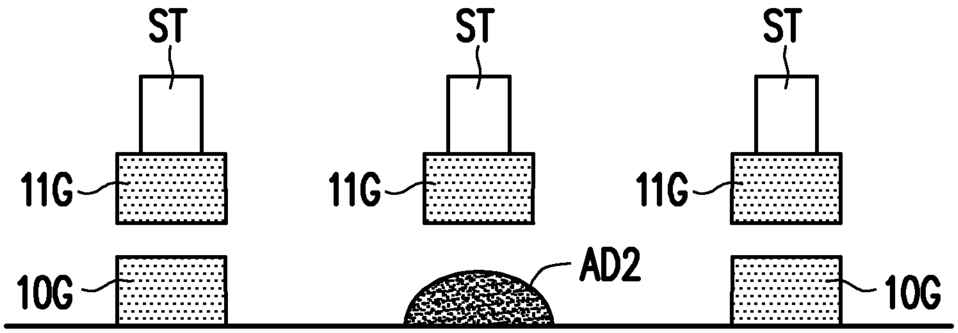
FIG. 3F is a schematic side view of transposed element heads ST fetching sub-pixels for pressing in FIG. 3E.

For operation details of FIG. 3E, refer to FIG. 3F. FIG. 3F is a schematic side view of transposed element heads ST fetching sub-pixels 11G for pressing in FIG. 3E. In FIG. 3F, some elements (e.g., sub-pixels 10R, 10B) are omitted for convenience of description.

Specifically, when the transposed element head ST fetches and presses the sub-pixel 11G, the transposed element head ST may press the sub-pixel 11G to be above the main pixel region RB where the sub-pixel 10G has been previously removed. On the other hand, since the transposed element head ST has an array structure, the transposed element head ST also presses the sub-pixel 11G to be above the sub-pixel 10G of the other pixel PX3. Furthermore, to allow the sub-pixel 11G to be better adhered by a second adherent material AD2, the transposed element head ST may apply a certain pressure to press the sub-pixel 11G to be above the main pixel region RB where the sub-pixel 10G is removed without damaging other sub-pixels 10G.

Figure 3G:
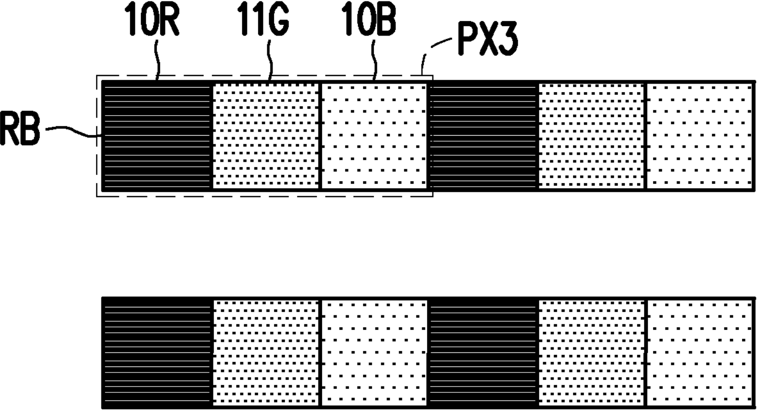

In FIG. 3G, when the transposed element head ST leaves the substrate 12, with the second adherent material AD2, only the sub-pixel 11G in the pixel PX3 in the upper left corner may be left, so the defective sub-pixel 10G may be replaced. In addition, in the replaced pixel PX3, the height of the sub-pixel 11G on the substrate 12 may be greater than the height of the sub-pixels 10R and 10B.

Figures 4A, 4B, 4C:
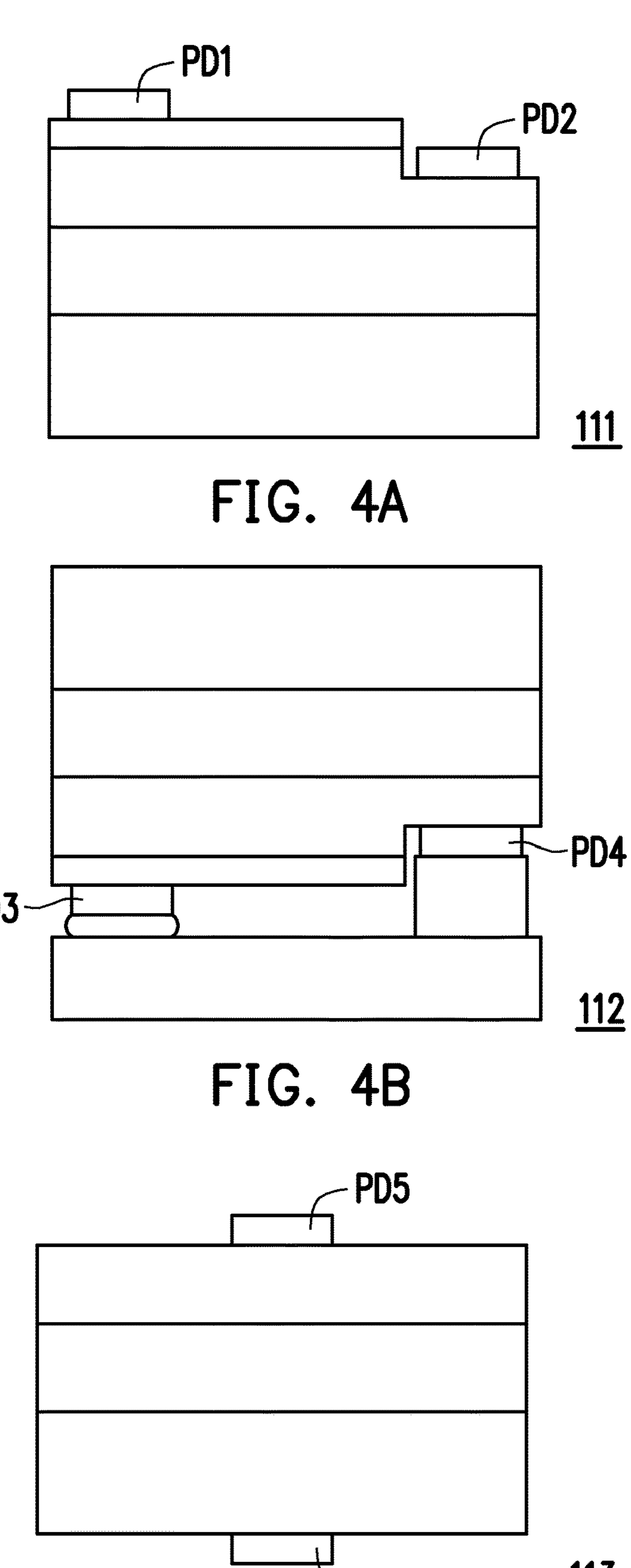
FIG. 4A to FIG. 4C are schematic views of sub-pixels adopted for replacement according to an embodiment of the disclosure.

FIG. 4A to FIG. 4C are schematic views of sub-pixels 111-113 adopted for replacement according to an embodiment of the disclosure.

In FIG. 4A, the sub-pixel 111 adopted for replacement may be, for example, a chip with a lateral structure, and two pads PD1 and PD2 are disposed above the sub-pixel 111. Accordingly, when being placed, the sub-pixel may be adhered to the substrate through a non-conductive second adherent material, and the sub-pixel 111 is electrically connected to the pads PD1 and PD2 above through indium tin oxide (ITO).

In FIG. 4B, the sub-pixel 112 adopted for replacement may be, for example, a chip with a structure fabricated by flip chip technology, and two pads PD3 and PD4 are disposed below the sub-pixel 112. Accordingly, when being placed, the sub-pixel 112 may be adhered to the substrate through a conductive second adherent material and further electrically connected to the pads PD3 and PD4. Alternatively, when being placed, the sub-pixels 112 may be adhered to the substrate through a non-conductive second adherent material, and a certain pressure is applied through the transposed element head to allow the pads PD3 and PD4 of the sub-pixels 112 to be in direct contact with and electrically connected to the substrate.

In FIG. 4C, the sub-pixel 113 adopted for replacement may be, for example, a chip with a vertical structure, and pads PD5 and PD6 are disposed above and below the sub-pixel 113, respectively. Accordingly, when being placed, the sub-pixel 113 may be adhered to the substrate through a conductive second adherent material and to be electrically connected to the pad PD6.

Figure 5A:
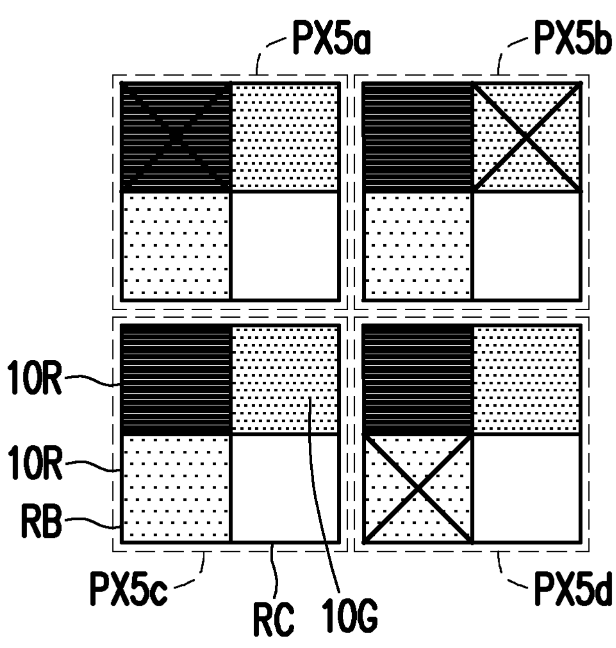
FIG. 5A to FIG. 5C are schematic views of the arrangement of pixels according to an embodiment of the disclosure.
Figure 5B:
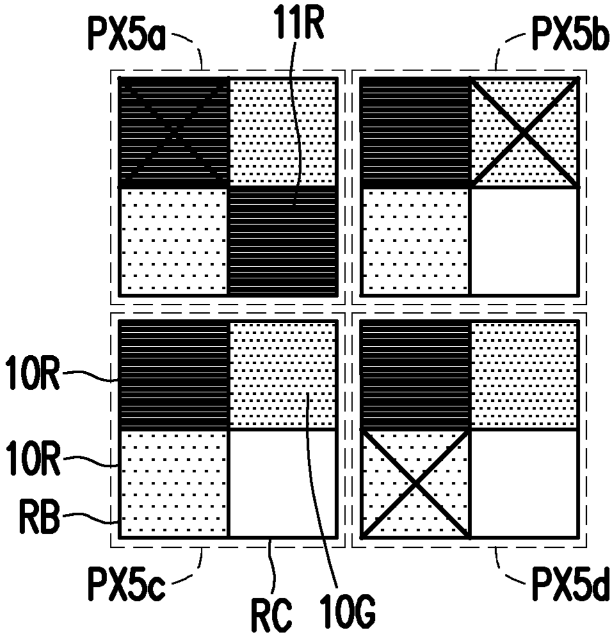
Figure 5C:
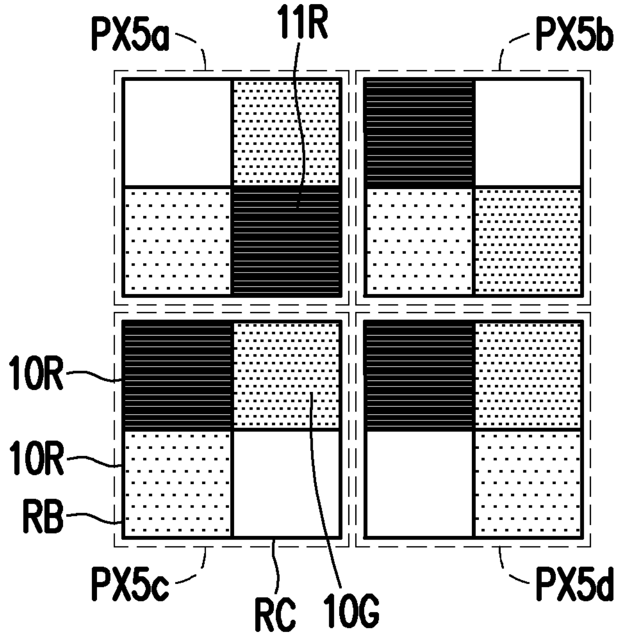

FIG. 5A to 5C are schematic top views illustrating a manufacturing process of pixels PX**5*a* to PX5*d* in a display panel according to an embodiment of the disclosure. In the embodiment, the pixels PX5*a* to PX5*d*** may be divided into three main pixel regions RB and only one spare pixel region RC.

In FIG. 5A, it is determined that the sub-pixel 10R in the upper left corner of the pixel PX**5*a*, the sub-pixel 10G in the upper right corner of the pixel PX5*b*, and the sub-pixel 10B in the lower left corner of the pixel PX5*d*** are defective sub-pixels after inspection.

In FIG. 5B, after coating the second adherent material in the spare pixel region RC of the pixel PX5*a*, and after the transposed element head fetches and places the sub-pixel 11R on the substrate, the sub-pixel 11R may be disposed in the spare pixel region RC of the pixel PX5*a*.

In FIG. 5C, after repeating the operation of FIG. 4B, the sub-pixels 11G and 11B may be disposed in the spare pixel regions RC of the pixels PX5*b* and PX5*d*, respectively. In addition, the defective sub-pixels 10R, 10G and 10B in the pixels PX5*a*, PX5*b*, and PX5*d* may also be removed.

In the manufacturing process shown in FIG. 2A to FIG. 2F and FIG. 3A to FIG. 3G, the defective sub-pixels are removed first, and then the replacement sub-pixels are placed, but when there is a spare pixel region, the step of removing defective sub-pixels may be flexibly adjusted. For example, removing the defective sub-pixel after placing the replaced sub-pixel shall also fall within the scope of the embodiments of the disclosure.

FIG. 6A to FIG. 6G are schematic views of the arrangement of pixels according to an embodiment of the disclosure. Those skilled in the art may adjust the number of spare pixel regions in the display pixel region or the arrangement between the main pixel region and the spare pixel region in the display pixel region according to different design requirements, so FIG. 6A to FIG. 6G exemplarily illustrate a schematic view of the arrangement of various pixels.

In FIG. 6A, a pixel PX6A may be divided into three main pixel regions and three spare pixel regions, and each main pixel region and the corresponding spare pixel region are disposed adjacent to each other.

In FIG. 6B, a pixel PX6B may be divided into three main pixel regions and only one spare pixel region. The main pixel regions and the spare pixel region together may be arranged in a rectangle shape or a square shape, so that each main pixel region is adjacent to the spare pixel region.

In FIG. 6C, a pixel PX6C may be divided into three main pixel regions and only one spare pixel region, and the main pixel regions and the spare pixel region together may be arranged in a T-shape. Specifically, the three main pixel regions together may be arranged in a row, and the spare pixel region is arranged below the row of the T-shape.

In FIG. 6D, the pixel PX6C may be divided into three main pixel regions and only one spare pixel region, and the main pixel regions and the spare pixel region together may be arranged in a T-shape. Specifically, the spare pixel regions are arranged at the center of the row of the T-shape, and the three main pixel regions are arranged at the three tops of the T-shape.

In FIG. 6E, the pixel PX6C may be divided into three main pixel regions and only one spare pixel region. The main pixel regions may be rectangular, have same sizes, and together are arranged in one single row. The spare pixel region is arranged below the row of the main pixel regions, so that the main pixel regions and the spare pixel region together form a rectangle.

To the left of FIG. 6F, a pixel PX6F1 may have two main pixel regions and only one spare pixel region. Red and green sub-pixels may be disposed in the two main pixel regions, respectively. Furthermore, a pixel PX6F2 may be connected to the right of the pixel PX6F1 and also has two main pixel regions and only one spare pixel region. Blue and green sub-pixels may be disposed in the main pixel regions of the pixel PX6F2, respectively. Therefore, by repeatedly configuring the pixels PX6F1 and PX6F2, the pixels in the display array together may be arranged in the form as shown in the right of FIG. 6F.

To the left of FIG. 6G, pixels PX6G1 and PX6G2 may share a spare pixel region. Specifically, the pixels PX6G1 and PX6G2 may have red, green, and blue sub-pixels, respectively, and the six sub-pixels together are disposed around the spare pixel region. Therefore, by repeatedly configuring the pixels PX6G1 and PX6G2, the pixels in the display array together may be arranged in the form as shown in the right of FIG. 6G.

In summary, in the display panel and the manufacturing method thereof in the disclosure, the second pixels are optionally adhered to the vacant display pixel regions through the second adherent material. This allows the first pixel and the second pixel to be disposed through the same transposed element head in the manufacturing process of the display panel, and accordingly the defects on the display panel can be repaired through a relatively simple hardware device and a relatively short operation process to improve the display effect of the display panel.

What is claimed is:

1. A display panel comprising:

a substrate;

a plurality of first sub-pixels disposed on the substrate, wherein the plurality of first sub-pixels have a first orienting characteristic, and a first adherent material is disposed between the plurality of first sub-pixels and the substrate; and a plurality of second sub-pixels disposed on the substrate, wherein the plurality of second sub-pixels have a second orienting characteristic, and a second adherent material is disposed between the plurality of second sub-pixels and the substrate, wherein the first orienting characteristic is different from the second orienting characteristic, and the first adherent material is different from the second adherent material, wherein the plurality of first sub-pixels and the plurality of second sub-pixels are disposed in a plurality of corresponding display pixel regions, respectively, the first orienting characteristic comprises a first position offset and a first angle offset between each of the plurality of first sub-pixels and each of the plurality of corresponding display pixel regions, and the second orienting characteristic comprises a second position offset and a second angle offset between each of the plurality of second sub-pixels and each of the plurality of corresponding display pixel regions, the first position offset and the second position offset are different, and the first angle offset and the first angle offset are different, wherein the first adherent material is solder and the second adherent material includes a sticky material.

2. The display panel of claim 1, wherein the first adherent material or the second adherent material comprises metals, photoresists, resin, colloids, black light shielding layers, color filters, or quantum dots.

3. The display panel of claim 1, comprising the plurality of display pixel regions, each of the plurality of display pixel regions comprises a main pixel region and a spare pixel region, wherein one of plurality of sub-pixels is disposed in one of the main pixel region and the spare pixel region.

4. The display panel of claim 1, wherein there is a first height between the plurality of first sub-pixels and the substrate, there is a second height between the plurality of second sub-pixels and the substrate, and the first height and the second height are different.

5. The display panel of claim 4, wherein the second height is greater than the first height.

6. A manufacturing method of a display panel, comprising:

providing a substrate;

disposing a plurality of first sub-pixels on the substrate, wherein the plurality of first sub-pixels have a first orienting characteristic, and a first adherent material is disposed between the plurality of first sub-pixels and the substrate; and disposing a plurality of second sub-pixels on the substrate, wherein the plurality of second sub-pixels have a second orienting characteristic, and a second adherent material is disposed between the plurality of second sub-pixels and the substrate, wherein the first orienting characteristic is different from the second orienting characteristic, and the first adherent material is different from the second adherent material, wherein the plurality of first sub-pixels and the plurality of second sub-pixels are disposed in a plurality of corresponding display pixel regions, respectively, the first orienting characteristic comprises a first position offset and a first angle offset between each of the plurality of first sub-pixels and each of the plurality of corresponding display pixel regions, and the second orienting characteristic comprises a second position offset and a second angle offset between each of the plurality of two sub-pixels and each of the plurality of corresponding display pixel regions, the first position offset and the second position offset are different, and/or the first angle offset and the first angle offset are different, wherein the first adherent material is solder and the second adherent material includes a sticky material.

7. The manufacturing method of claim 6, wherein the first adherent material or the second adherent material comprises metals, photoresists, resin, colloids, black light shielding layers, color filters, or quantum dots.

8. The manufacturing method of claim 6, further comprising providing the plurality of display pixel regions, wherein each of the plurality of display pixel regions comprises a main pixel region and a spare pixel region, and one of the plurality of sub-pixels is disposed on one of the main pixel region and the spare pixel region.

9. The manufacturing method of claim 6, comprising:

determining that there is a defective third sub-pixel from the plurality of first sub-pixels by inspecting the plurality of first sub-pixels after disposing the plurality of first sub-pixels;

removing the third sub-pixel; and disposing the plurality of second sub-pixels in a plurality of marked display pixel regions from which the third sub-pixel is removed.

10. The manufacturing method of claim 9, wherein the step of disposing the plurality of second sub-pixels in the plurality of marked display pixel regions from which the third sub-pixel is disposed comprises:

disposing the plurality of second sub-pixels in the plurality of display marked pixel regions after coating the second adherent material in the plurality of marked display pixel regions.

11. The manufacturing method of claim 6, wherein there is a first height between the plurality of first sub-pixels and the substrate, there is a second height between the plurality of second sub-pixels and the substrate, the first height and the second height are different.

12. The manufacturing method of claim 11, wherein the second height is greater than the first height.

13. A display panel comprising:

a substrate;

a plurality of first sub-pixels disposed on the substrate, wherein the plurality of first sub-pixels have a first orienting characteristic, and a first adherent material is disposed between the plurality of first sub-pixels and the substrate; and a plurality of second sub-pixels disposed on the substrate, wherein the plurality of second sub-pixels have a second orienting characteristic, and a second adherent material is disposed between the plurality of second sub-pixels and the substrate, wherein the first orienting characteristic is different from the second orienting characteristic, and the first adherent material is different from the second adherent material, wherein the plurality of first sub-pixels and the plurality of second sub-pixels are disposed in a plurality of corresponding display pixel regions, respectively, the first orienting characteristic comprises a first position offset and a first angle offset between each of the plurality of first sub-pixels and each of the plurality of corresponding display pixel regions, and the second orienting characteristic comprises a second position offset and a second angle offset between each of the plurality of second sub-pixels and each of the plurality of corresponding display pixel regions, the first position offset and the second position offset are different, and the first angle offset and the first angle offset are different.

* * * * *